United States Patent [19]

Pavoni et al.

[11] 3,961,311

[45] June 1, 1976

[54] CIRCUIT ARRANGEMENT FOR CORRECTING SLIP ERRORS IN RECEIVER OF CYCLIC BINARY CODES

[75] Inventors: Gustavo Pavoni, Milan; Enzo Repossi, Voghera; Mario Loiudice, Monza, all of Italy

[73] Assignee: Societa Italiana Telecomunicazioni Siemens S.p.A., Milan, Italy

[22] Filed: Dec. 27, 1974

[21] Appl. No.: 536,992

[30] Foreign Application Priority Data

Dec. 27, 1973 Italy .................................. 32267/73

[52] U.S. Cl. ......................................... 340/146.1 D
[51] Int. Cl.² ..................... G06F 11/00; H04L 7/00
[58] Field of Search ........................... 340/146.1 D; 178/69.5 R; 340/172.5

[56] References Cited

UNITED STATES PATENTS

| | | | |
|---|---|---|---|
| 3,394,224 | 7/1968 | Helm | 340/146.1 D |
| 3,466,601 | 9/1969 | Tong | 340/146.1 D |
| 3,550,082 | 12/1970 | Tong | 340/146.1 D |
| 3,562,710 | 2/1971 | Halleck | 340/146.1 D |
| 3,571,794 | 3/1971 | Tong | 340/146.1 D |
| 3,596,245 | 7/1971 | Finnie et al. | 340/146.1 D |
| 3,648,237 | 3/1972 | Frey, Jr. et al. | 340/146.1 D |
| 3,733,585 | 5/1973 | Merlo | 340/146.1 D |

*Primary Examiner*—Charles E. Atkinson
*Attorney, Agent, or Firm*—Karl F. Ross; Herbert Dubno

[57] ABSTRACT

A code receiver of a data-transmission system, using regular or abbreviated cyclic codes wherein each n-bit code word consists of k information bits and (n-k) redundancy bits together constituting the coefficients of a complex polynomial which is a multiple of a predetermined generator polynomial, comprises a shift register for the incoming code words with (n+2s) stages. The n central stages of that shift register temporarily store, during each transmission cycle, the n bits of the code word while the last s bits of the immediately preceding word and the first s bits of the immediately following word are stored in respective supplemental stages. A divider, connected to the central section of the shift register, calculates the remainder of a division of the composite polynomial by the generator polynomial and feeds the result to three discriminating networks which ascertain, respectively, whether the remainder (a) is zero, (b) contains bits characteristic of a backward slip by up to s code bits, or (c) contains bits characteristic of a forward slip by up to s code bits. In case (a), the stored code word is read out to a load such as a message decoder. In case (b), the shift register is stepped to perform a compensating forward shift; in case (c) it is stepped in the reverse sense. If the shift results in a zero remainder, the modified code word is read out; otherwise, the shift register is restored and an error signal is generated, this error signal coming also into existence if none of the three discriminating networks has an output.

7 Claims, 4 Drawing Figures

CIRCUIT ARRANGEMENT FOR CORRECTING SLIP ERRORS IN RECEIVER OF CYCLIC BINARY CODES

FIELD OF THE INVENTION

Our present invention relates to a data-transmission system and, more particularly, to a receiver for cyclic (regular or abbreviated) code words arriving in continuous succession over a communication channel.

BACKGROUND OF THE INVENTION

In order to provide a check on the accuracy of an incoming code word and to facilitate the correction of errors, use is being made in such data-transmission systems of binary code words in $n$ bits each which consist of a group of $k$ information bits supplemented by $(n-k)$ redundancy bits, all these bits constituting respective coefficients of a composite polynomial which normally is a multiple of a predetermined generator polynomial. The first $k$ bits, associated with the highest terms of the $(n-1)^{th}$- order polynomial, represent the information bits whereas the remaining $(n-k)$ bits serve as a check. If the word is correctly received, division of the generator polynomial into the composite polynomial results in an integral quotient, with zero remainder. A detector circuit can thus decide whether the received word is to be delivered to a load for which it is intended, such as a message decoder, or whether an error signal is to be generated.

In conventional systems of this nature, the error signal is retransmitted to the originating system to elicit a repetition of all or part of the preceding message, or to initiate a complicated search for the source of the mistake. This is unavoidable if the source is in the communication channel, i.e. if bits are lost or distorted during transmission. In many instances, however, the error is merely the result of faulty synchronization, i.e. a simple slip in the timing of the incoming signals causing the bit count to commence before the end of a preceding word or after the beginning of a succeeding one. Such a slip, if due to a nonrecurrent malfunction of the synchronizing circuits, could be readily remedied if correctly recognized.

OBJECT OF THE INVENTION

The object of our present invention, therefore, is to provide means in a receiver for cyclic code words to distinguish between transmission errors, on the one hand, and forward or backward slips, on the other hand, for the purpose of correcting any such slip as soon as it occurs.

SUMMARY OF THE INVENTION

We realize this object, in accordance with our present invention, by the provision of a shift register receiving the incoming succession of $n$-bit code words, this shift register including a group of $n$ intermediate stages for the temporary storage of the bits for a code word to be decoded, a number $s$ 1 of initial stages upstream of the intermediate stages for the temporary storage of the first bit or bits of an immediately succeeding code word, and a preferably like number $s$ of terminal stages downstream of the intermediate stages for the temporary storage of the last bit or bits of an immediately preceding code word. The intermediate stages are connected to a dividend input of a binary divider having a divisor input connected to a source of the aforementioned generator polynomial, this divider having an output circuit which carries bits of a remainder resulting from the division of the generator polynomial into the composite polynomial of order $(n-l)$ corresponding to the bits stored in the $n$ intermediate stages of the shift register. A discriminator connected to the divider output, such as a set of three logical decoding matrices, generates a first signal whenever that remainder is zero, a second signal in response to remainder values indicative of a backward slip of the stored code word by a number of bit positions not exceeding the number of initial stages, and a third signal in response to remainder values indicative of a forward slip by a number of bit positions not exceeding the number of terminal stages. The appearance of the first signal opens a gate for reading out the stored $n$-bit code word from the intermediate register stages to the load. If, however, the second or the third signal is generated, one of two stepping inputs of the shift register is energized to shift the stored bits either forward or backward to an extent compensating for the slip indicated by the remainder present in the divider output.

According to another feature of our invention, a control unit connected between the divider output and the stepping inputs of the shift register reverses the shift of the stored bits whenever the original shift is not followed by the appearance of the first signal, i.e. when the error did not actually result from a slip but only fortuitously created an appearance thereof. In that event, the $n$-bit word restored to the intermediate stages of the shift register is read out into an error indicator, the same as it would if all three discriminator signals were simultaneously absent because of an error correctly recognized as due to transmission failure.

BRIEF DESCRIPTION OF THE DRAWING

The above and other features of our invention will now be described in detail with reference to the accompanying drawing in which.

SPECIFIC DESCRIPTION

Figure 1:
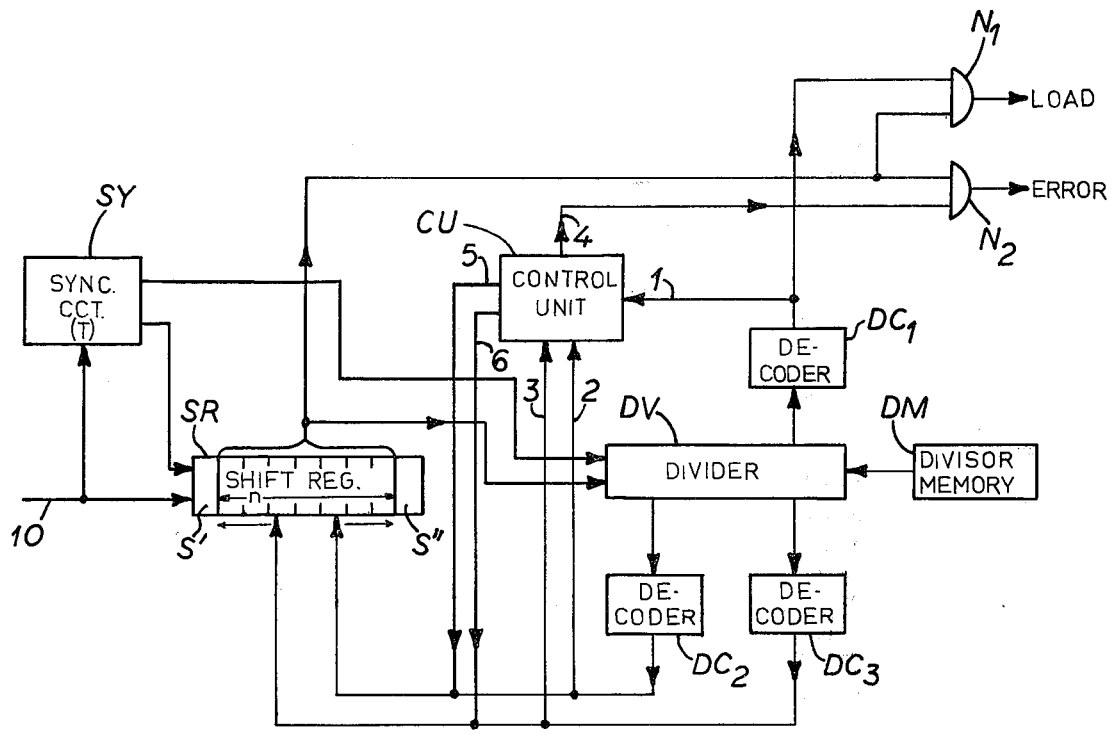
FIG. 1 is a block diagram of a receiver embodying slip-correcting circuitry in accordance with our invention.

Consider an information polynomial of the form $$I(x) = a_{n-1}x^{n-1} + a_{n-2}x^{n-2} + \ldots + a_{n-k}x^{n-k}$$

and a remainder polynomial $$R(x) = b_{n-k-1}x^{n-k-1} + b_{n-k-2}x^{n-k-2} + \ldots + b_0$$

with $x = 2$ in the binary system here discussed. Polynomial $R(x)$ constitutes the remainder obtained upon dividing a predetermined generator polynomial $G(x)$ into the information polynomial $I(x)$. Upon combining the information polynomial $I(x)$ with a redundancy polynomial $\overline{R(x)}$, representing the complement of polynomial $R(x)$, we obtain a composite polynomial $P(x)$ of the $(n-1)^{th}$ order with coefficients $a_{n-1}, a_{n-2}, \ldots a_{n-k}$, $\overline{b_{n-k-1}}, \overline{b_{n-k-2}}, \ldots \overline{b_0}$. The coefficients of this composite polynomial constitute the $n$ bits of a code word transmitted over a line or other communication channel, shown at 10 in FIG. 1, to a receiving station including a shift register SR of $n+2s$ stages, the $n$ principal stages being sandwiched between $s$ upstream stages and $s$ downstream stages S', S''. In the present instance, for the sake of simplicity, $s=1$.

The $n$ central stages of shift register SR are connected over two sets of parallel lines to a dividend input of a binary divider DV as well as to two AND gates $N_1$ and $N_2$ (actually, a set of parallel AND gates in each instance). Divider DV has a divisor input connected to a memory DM which stores the generator polynomial $G(x)$. By suitably weighting the $n$ bits temporarily stored in the intermediate section of shift register SR, divider DV reconstitutes the composite polynomial $P(x)$ into which it divides the generator polynomial $G(x)$ from divisor memory DM. The resulting quotient is of no interest, yet the remainder (if any) is read out to a discriminating network constituted by three logic matrices $DC_1$, $DC_2$, $DC_3$ for decoding. Normally, the received polynomial $P(x)$ is an exact multiple of the generator polynomial $G(x)$ so that the remainder is zero; this condition is detected by decoder $DC_1$ which thereupon emits a first signal on an output lead 1 to unblock the AND gate $N_1$ and to pass the stored $n$ bits from the intermediate stages of register SR to a load such as a message decoder not further illustrated. This first signal is also delivered to a control unit CU more fully described below with reference to FIG. 2. Divider DV, like shift register SR, is periodically actuated by a synchronizing circuit SY extracting timing signals from the incoming line 10 in the conventional manner, thereby enabling the readout to its dividend input of the $n$ bits normally loaded into the register during a preceding transmission cycle.

If the remainder calculated by divider DV is not zero and does not have certain characteristic values detectable by decoders $DC_2$ and $DC_3$, as discussed hereinafter, control unit CU energizes a lead 4 to open the AND gate $N_2$ which reads out the stored $n$-bit word from register SR to an error indicator.

In certain instances, the output of divider DV will carry a remainder indicative of a slip, triggering either the decoder $DC_2$ or the decoder $DC_3$ to emit a second or a third signal on a lead 2 or 3 extending to the control unit CU as well as to respective stepping inputs of shift register SR. A backward slip by one bit position has been schematically illustrated in FIG. 3. The transmitted $n$-bit word P, as shown there, consists of the aforementioned bits $a_{n-1} \ldots \overline{b_0}$; because of the slip, however, bit $\overline{b_0}$ has not reached the main register section but has remained in its upstream supplemental section S' whereas a bit $\overline{b'_0}$ from the preceding word occupies the last one of the $n$ principal stages. Thus, the code word actually delivered to divider DV is a modified bit combination P'.

The loss of bit $\overline{b_0}$ and the acquisition of bit $\overline{b'_0}$, coupled with an effective downshift of the remaining bits, gives rise to several possible remainders which trigger the generation of the second signal by decoder $DC_2$. This signal steps the shift register in the forward sense to restore the word P to its proper position in the main register section. Thus, the remainder read out from divider DV will now be zero so that decoder $DC_1$ energizes its output lead 1 to unblock the AND gate $N_1$ for transmittal of the word P to the message decoder.

Figure 4:
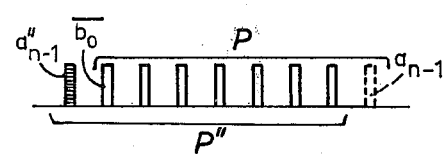

In an analogous manner, as shown in FIG. 4, a forward slip by one bit position causes an effective upshift with transfer of bit $a_{n-1}$ to supplemental stage S'' and an entry of the first bit $a''_{n-1}$ from the next-following word into the main section of register SR. The modified word P'' produces a remainder of any of several characteristic values which trigger the decoder $DC_3$ into energizing its output lead 3 to cause a compensating downshift of the stored bits. In this manner, as before, the word P is returned to its correct position in the register SR and can be read out to the message decoder as soon as logic matrix $DC_1$ responds to the disappearance of the remainder from divider DV.

The characteristic remainder values, however, could also be due to a transmission error having nothing to do with either a forward or a backward slip. In such an instance, decoder $DC_1$ does not emit an unblocking signal for gate $N_1$ after the shift whereupon control unit CU energizes one of two leads 5 and 6 which merge with leads 2 and 3, respectively, to produce a reverse shift in register SR. With the original word P thus restored to its effective position, unit CU now unblocks the AND gate $N_2$ via lead 4 to read out this word to the error indicator as in the case of any transmission failure.

Figure 2:
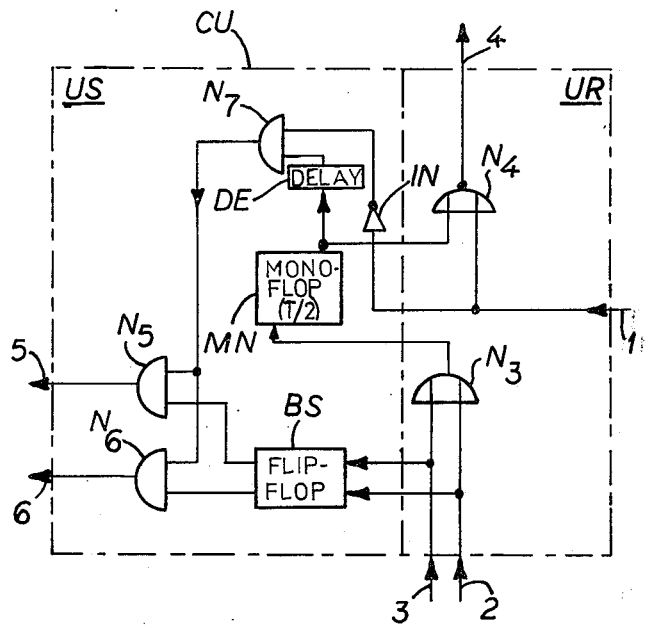
FIG. 2 is a more detailed diagram of a control unit forming part of the receiver of FIG. 1.

As shown in FIG. 2, control unit CU comprises a gating section UR and a reversing section US. The gating section UR comprises an OR gate $N_3$ connected to receive the output signals of decoders $DC_2$ and $DC_3$ via leads 2 and 3, respectively. These leads also extend to respective inputs of a flip-flop BS in section US having output leads $u$ and $\overline{u}$ which terminate at respective AND gates $N_5$ and $N_6$. OR gate $N_3$ feeds a monostable circuit or monoflop MN with an off-normal period $T/2$ representing a verification interval equal to half a timing period T of synchronizing circuit SY during which the contents of the $n$ intermediate register stages are read out to divider DV. Output lead 1 of decoder $DC_1$ extends to an input of a NOR gate $N_4$ and, via an inverter IN, to an input of an AND gate $N_7$ working into the other inputs of AND gates $N_5$ and $N_6$ in parallel. Monoflop MN, when tripped, energizes the other inputs of NOR gate $N_4$ and AND gate $N_7$. Leads 4, 5 and 6 emanate from gates $N_4$, $N_5$ and $N_6$, respectively.

Whenever an incoming word checks out properly to energize the lead 1, NOR gate $N_4$ has no output so that gate $N_2$ (FIG. 1) remains blocked. Since in that case the leads 2 and 3 are also de-energized, OR gate $N_3$ does not conduct.

If decoder $DC_2$ or $DC_3$ recognizes a remainder as indicative of a backward or forward slip, flip-flop BS is placed in the corresponding position (if it had previously been in its alternate position) to unblock the AND gate $N_6$ or $N_5$, respectively. Monoflop MN also responds and blocks the NOR gate $N_4$ while energizing, via a delay circuit DE, one of the inputs of AND gate $N_7$ whose other input is energized at the same time through inverter IN because of the absence of an output from decoder $DC_1$. The delay is necessary to allow the shift register SR (FIG. 1) to respond to the energization of either of its stepping inputs by a signal from decoder $DC_2$ or $DC_3$; if the resulting shift does not give rise to an output signal on lead 1, AND gate $N_6$ or $N_5$ energizes lead 6 or 5 to perform the reverse shift. Upon the subsequent restoration of monoflop MN to normal, NOR gate $N_4$ conducts in the latter half of the readout period T to energize the lead 4 so that the stored bits can be read out through gate $N_2$ to the error indicator.

Figure 3:
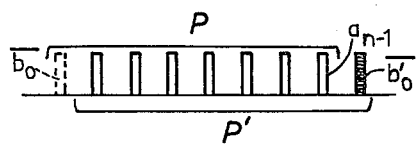
FIGS. 3 and 4 are two graphs serving to explain the operation of our system.

As will be apparent from FIG. 3, a polynomial $P'(x)$ can be derived from polynomial $P(x)$ by the relationship $$P'(x) = \frac{P(x) - \overline{b_0}}{2} + \overline{b'_0} \cdot 2^{n-1} \tag{1}$$

Similarly, according to FIG. 4, a polynomial $P''(x)$ is derivable from polynomial $P(x)$ by the relationship $$P''(x) = 2[P(x) - a_{n-} \cdot 2^{n-1}] + a''_{n-1} \tag{2}$$

Since, by definition, $$P(x) = Q \cdot G(x) \tag{3}$$

where Q is the quotient of the division, we obtain the following values for the modified quotients $$Q' = \frac{P'(x)}{G(x)} \text{ and } Q'' = \frac{P''(x)}{G(x)}:$$

$$Q' = \frac{Q}{2} - \frac{\overline{b_0}}{2G(x)} + \frac{\overline{b'_0}}{G(x)} \cdot 2^{n-1} - R'(x) \tag{4}$$

$$Q'' = 2Q - \frac{a_{n-1}}{G(x)} \cdot 2^n + \frac{2a''_{n-1}}{G(x)} - R''(x) \tag{5}$$

where $R'(x)$ and $R''(x)$ are the respective remainders.

For simplicity's sake, we may assume that the divider doubles the resulting quotient, replacing the variable $Q/2$ by $Q$ which is always an integer and does not enter into the computation of the remainder. We can then write $$R'(x) = r'[b'_0 \cdot 2^n / G(x)] - \overline{b_0} \tag{6}$$

and
$$R''(x) = 4a''_{n-1} - r''[a_{n-1} \cdot 2^{n+1} / G(x)] \tag{7}$$

where $r'$ and $r''$ denote the remainders or fractional parts of the bracketed terms.

Let us consider, for example, the case where $n = 11$ (decimal) and $G(x) = 19$ (binary 10011). This yields the values $r' = 15\overline{b'_0}$ and $r'' = 11a_{n-1}$. From equation (6) we get $$R'(x) = 15\overline{b'_0} \cdot \overline{b_0}_{63}$$
and equation (7) yields
$$R''(x) = -11a_{n-} + 4a''_{n-}$$

Since the coefficients $a_{n-1}$, $a''_{n-1}$, $\overline{b_0}$ and $\overline{b'_0}$ can each assume a value of either 0 or 1, and since any negative remainder can be replaced by its positive complement, we have the following possible values for $R'(x)$ and $R''(x)$:

$R'(x) \ldots 0, 14, 15, 18$ $R''(x) \ldots 0, 4, 8, 12$

Thus, decoder $DC_2$ responds to any of decimal values 14, 15, 18 whereas decoder $DC_3$ is triggered by value 4, 8 or 12. The value 0 does not concern us since in that case the slip error would not be recognized.

With a more complex system in which $s > 1$, i.e. with two or more supplemental stages $S'$, $S''$ at each end of shift register SR, the number of remainder values to choose from becomes correspondingly greater.

If the immediate emission of an error signal in the same cycle — after lack of verification of a slip — is not required, the OR gate $N_3$ could work directly into the NOR gate $N_4$ instead of via monoflop MN. This monoflop, on the other hand, would have to be replaced by more complicated timing means setting up several successive verification intervals within a cycle, between stepping commands transmitted to register SR, if the disclosed system is expanded to allow for shifts of two or more bit positions.

Register SR may be periodically loaded, via line 10, from a nonillustrated buffer register receiving the incoming bits at the rate at which they are transmitted. The readout into AND gates $N_1$ and $N_2$ is nondestructive so that the last bit or bits of a word already decoded are preserved for a further cycle in the supplemental stage or stages $S''$.

We claim:

1. In a receiver for cyclic binary codes forming $n$-bit code words with $k$ information bits and $(n-k)$ redundancy bits, the bits of each code word normally constituting the coefficients of a composite polynomial which is a multiple of a predetermined generator polynomial, in combination:

a shift register having an input connected to a communication channel carrying an unbroken succession of $n$-bit code words arriving during consecutive transmission cycles, said shift register including a group of $n$ intermediate stages for the temporary storage of the bits of an incoming code word to be decoded, at least one initial stage upstream of said intermediate stages for the temporary storage of the first bit of an immediately succeeding code word, and at least one terminal stage downstream of said intermediate stages for the temporary storage of the last bit of an immediately preceding code word;

a divider with a dividend input connected only to said intermediate stages, a divisor input connected to a source of said generator polynomial, and output means carrying bits of a remainder resulting from the division of said generator polynomial into the composite polynomial defined by said $n$ bits;

timing means for enabling the readout to said dividend input, during a predetermined period at the end of every $n$-bit transmission cycle, of the bits stored in said $n$ intermediate stages;

discriminating means connected to said output means for generating a first signal in response to said remainder being zero, a second signal in response to said remainder having values indicative of a backward slip of the stored code word by a number of bit positions not exceeding the number of said initial stages, and a third signal in response to said remainder having values indicative of a forward slip of the stored code word by a number of bit positions not exceeding the number of said terminal stages;

gate means connected to said intermediate stages and to said discriminator means for reading out the stored code word to a load in response to said first signal; and stepping means for said shift register connected to said output means for shifting the stored bits forward in response to said second signal and backward in response to said third signal, within said predetermined period, to an extent compensating for the slip indicated by said remainder, thereby enabling the readout of a corrected version of said stored code word to the load.

2. The combination defined in claim 1, further comprising control means connected between said output means and said stepping means for reversing the shift of the stored bits during said predetermined period in the absence of said first signal following the original shift.

3. The combination defined in claim 2 wherein said control means includes logical circuitry for emitting an error signal upon simultaneous absence of said first, second and third signals.

4. The combination defined in claim 2 wherein said control means includes a timing-pulse generator for establishing a verification interval in response to either of said first and second signals for the detection of said first signal.

5. The combination defined in claim 4, further comprising synchronizing means connected to said channel for establishing a succession of operating cycles for said shift register and said divider, said verification interval being a fraction of said operating cycle.

6. The combination defined in claim 4 wherein said control means includes a bistable storage circuit for said second and third signals and a gating circuit jointly controlled by said bistable storage circuit and said timing-pulse generator.

7. The combination defined in claim 1 wherein said output means comprises three decoders respectively generating said first, second and third signals.

* * * * *